(12) United States Patent
Morishita

(10) Patent No.: US 12,310,118 B2
(45) Date of Patent: May 20, 2025

(54) SEMICONDUCTOR DEVICE

(71) Applicant: Renesas Electronics Corporation., Tokyo (JP)

(72) Inventor: Yasuyuki Morishita, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 378 days.

(21) Appl. No.: 17/945,357

(22) Filed: Sep. 15, 2022

(65) Prior Publication Data

US 2023/0092555 A1 Mar. 23, 2023

(30) Foreign Application Priority Data

Sep. 21, 2021 (JP) ................................ 2021-153671

(51) Int. Cl.
*H10D 89/60* (2025.01)
*H10D 84/60* (2025.01)

(52) U.S. Cl.
CPC ........... *H10D 89/921* (2025.01); *H10D 89/60* (2025.01); *H10D 89/611* (2025.01)

(58) Field of Classification Search
CPC ..... H10D 89/60; H10D 89/921; H10D 89/611
See application file for complete search history.

(56) References Cited

U.S. PATENT DOCUMENTS

| | | | | |
|---|---|---|---|---|
| 2001/0045670 A1* | 11/2001 | Nojiri | ..................... | H01L 24/06 257/E23.152 |
| 2002/0135032 A1* | 9/2002 | Kwon | .................. | H10D 89/814 257/408 |
| 2013/0153959 A1 | 6/2013 | Noguchi | | |

FOREIGN PATENT DOCUMENTS

| | | | |
|---|---|---|---|
| JP | 2013098453 A | 5/2013 |
| JP | 2020161721 A | 10/2020 |

OTHER PUBLICATIONS

JP Office Action dated Jan. 22, 2025 issued in JP Application No. 2021-153671.

* cited by examiner

*Primary Examiner* — David Vu
*Assistant Examiner* — Brandon C Fox
(74) *Attorney, Agent, or Firm* — SCULLY, SCOTT, MURPHY & PRESSER, P.C.

(57) ABSTRACT

A semiconductor device includes a protection element configured by a MOSFET, and the protection element has a multilayer metal wiring structure. The multilayer metal wiring structure includes drain connection wirings connected to drain regions of the MOSFET and source connection wirings connected to source regions of the MOSFET. In a part of a layer of the multilayer metal wiring structure where both the drain connection wirings and the source connection wirings are present, only either the drain connection wirings or the source connection wirings are laid out in a grained pattern.

5 Claims, 14 Drawing Sheets

A-A'

A-A'

B-B'

B-B'

SEMICONDUCTOR DEVICE

CROSS-REFERENCE TO RELATED APPLICATIONS

The disclosure of Japanese Patent Application No. 2021-153671 filed on Sep. 21, 2021 including the specification, drawings and abstract is incorporated herein by reference in its entirety.

BACKGROUND

The present disclosure relates to a semiconductor device, and is a technique effectively applied to a semiconductor device having a protection element (protection circuit) against a surge pulse.

Some semiconductor devices have a protection element against a surge pulse. As a proposal of this kind of semiconductor devices, for example, Japanese Unexamined Patent Application Publication No. 2020-161721 is available.

There are disclosed techniques listed below. [Patent Document 1] Japanese Unexamined Patent Application Publication No. 2020-161721

SUMMARY

In the semiconductor device mounted in an automotive electronic control unit (ECU), tests are executed with a surge pulse width having a longer time axis than the ESD (Electro-Static Discharge (surge)) pulse. Even for consumer semiconductor devices, it has been gradually required to strengthen the long pulse resistance.

An object of the present disclosure is to provide a technique capable of improving the discharge performance or heat dissipation performance of a protection element (protection circuit) against a surge having a long pulse width.

Other problems and novel features will be apparent from the description of this specification and accompanying drawings.

The outline of the representative embodiment of the present disclosure will be briefly described as follows.

A semiconductor device according to the embodiment includes a protection element configured by a MOSFET, and the protection element has a multilayer metal wiring structure. The multilayer metal wiring structure includes drain connection wirings connected to drain regions of the MOSFET and source connection wirings connected to source regions of the MOSFET. In a part of a layer of the multilayer metal wiring structure where both the drain connection wirings and the source connection wirings are present, only either the drain connection wirings or the source connection wirings are laid out in a grained pattern.

By the semiconductor device according to the embodiment described above, it is possible to improve the discharge performance or heat dissipation performance of a protection circuit against a surge having a long pulse width.

DETAILED DESCRIPTION

Figure 1:
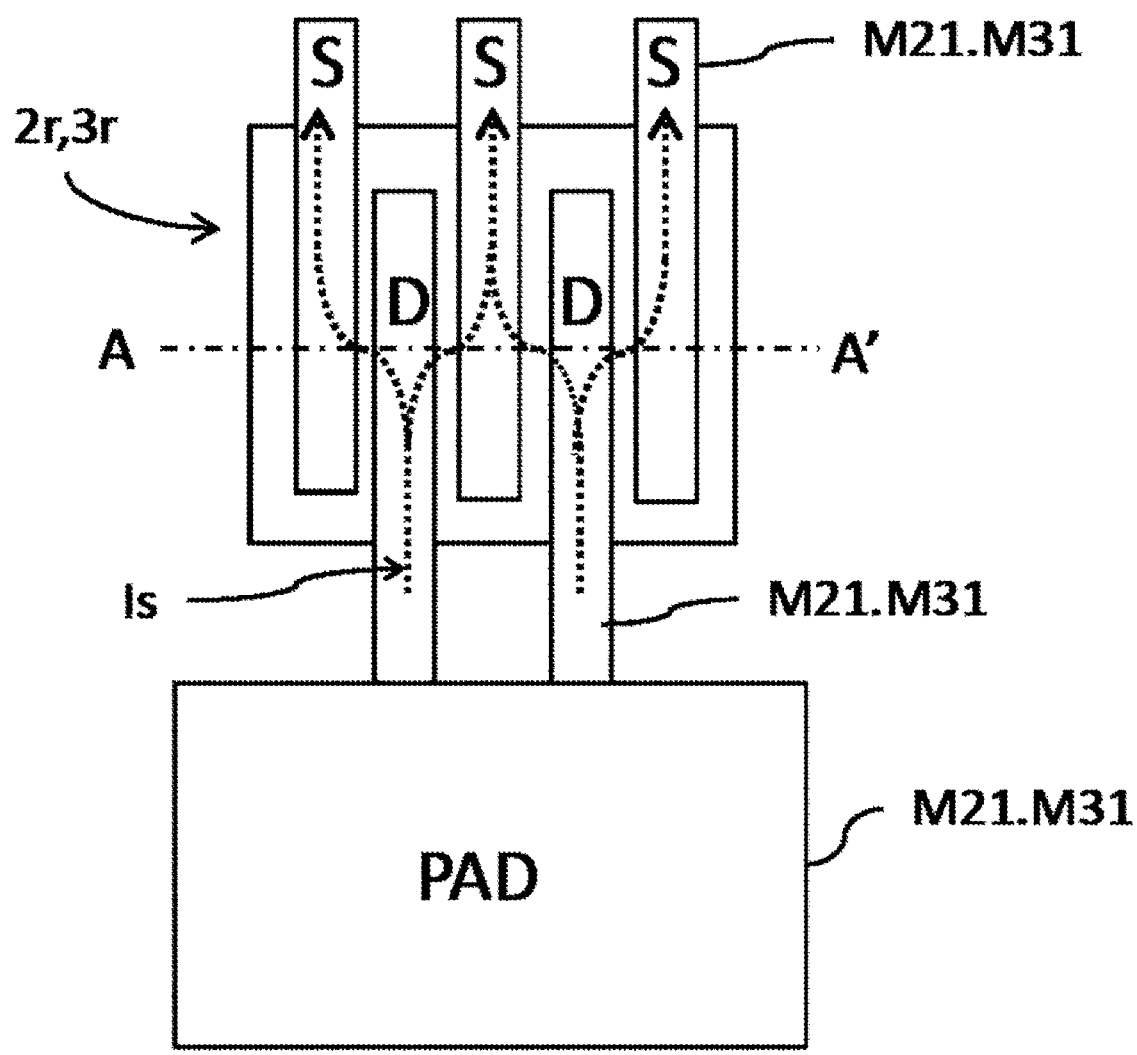
FIG. 1 is an explanatory plan view of a layout of a protection circuit according to the comparative example.

Hereinafter, the comparative example, the embodiment, and the examples will be described with reference to drawings. However, in the following description, the same components are denoted by the same reference characters and the repetitive description thereof will be omitted in some cases. Note that the drawings may be shown schematically as compared with an actual aspect in order to make the description clearer, but they are mere examples and do not limit the interpretation of the present invention.

Figure 2:
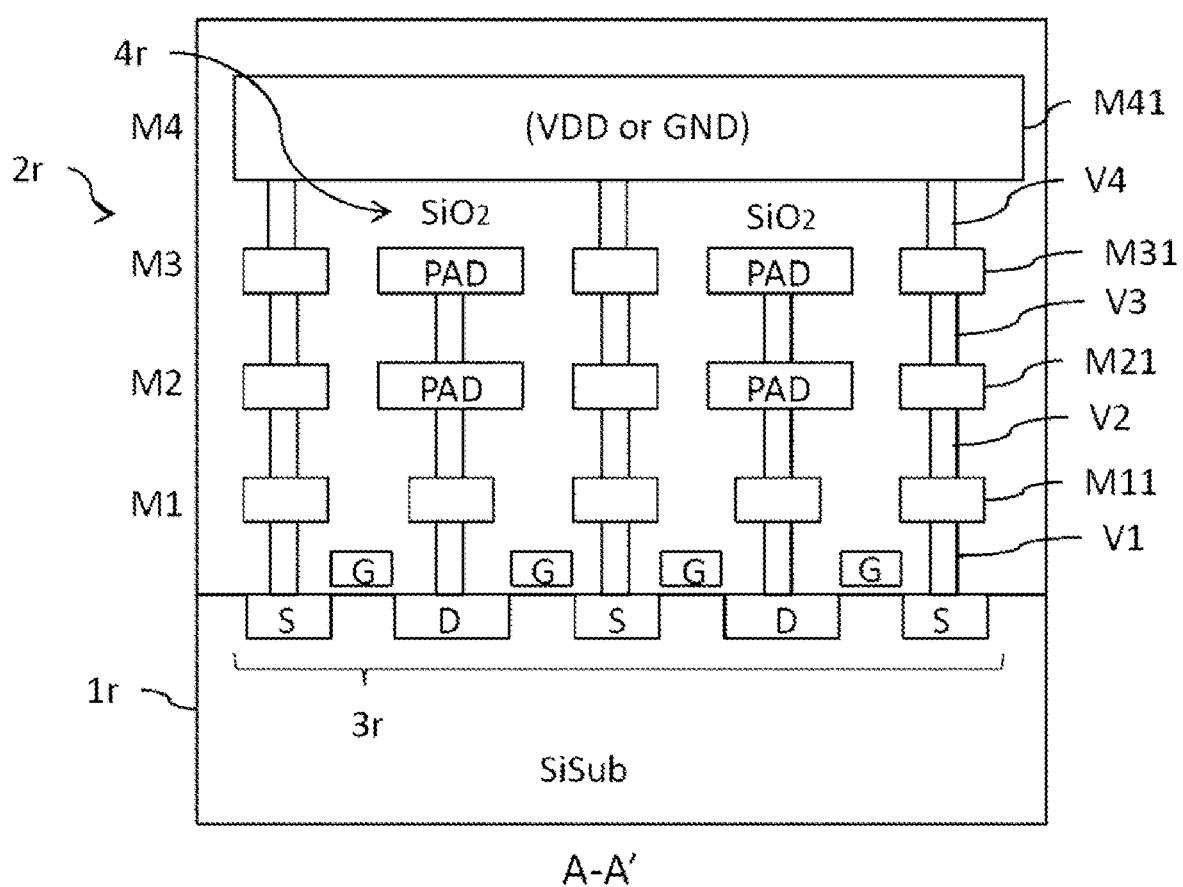
FIG. 2 is a cross-sectional view of the protection circuit taken along the line A-A' in FIG. 1.

Before the description of the embodiment, a configuration example of a layout of a protection circuit according to the comparative example will be described with reference to FIG. 1 and FIG. 2. FIG. 1 is an explanatory plan view of the layout of the protection circuit according to the comparative example. FIG. 2 is a cross-sectional view of the protection circuit taken along the line A-A' in FIG. 1. FIG. 1 illustrates wirings M21 composed of a second wiring layer M2 and wirings M31 composed of a third wiring layer M3 in the wiring layout of the protection circuit.

As shown in FIG. 1 and FIG. 2, a MOS protection element 3r constituting a protection circuit 2r has gate electrodes G, source regions S, and drain regions D. The source regions S and the drain regions D are formed in a silicon semiconductor substrate (SiSub) 1r, and the gate electrodes G are formed on an upper side of a gate oxide film (not shown) formed on the surface of the semiconductor substrate 1r.

The source region S is electrically connected to a fourth wiring M41 composed of a fourth wiring layer M4 through a first via electrode V1, a first wiring M11 composed of a first wiring layer M1, a second via electrode V2, a second wiring M21 composed of a second wiring layer M2, a third via electrode V3, a third wiring M31 composed of a third wiring layer M3, and a fourth via electrode V4. The fourth wiring M41 can be paraphrased as a bus wiring.

The drain region D is electrically connected to the third wiring M31 through the first via electrode V1, the first wiring M11, the second via electrode V2, the second wiring M21, and the third via electrode V3. The second wiring M21 and the third wiring M31 to which the drain region D is connected are connected to a pad electrode PAD. The first via electrode V1 can be paraphrased as a contact electrode.

The first to fourth wirings M11 to M41 and the first to fourth via electrodes V1 to V4 are made of metal such as copper (Cu) or aluminum (Al). The first to fourth wirings M11 to M41 and the first to fourth via electrodes V1 to V4 are covered with an insulating film (for example, silicon oxide film ($SiO_2$)) 4r having a relatively low thermal conductivity.

As shown in FIG. 1, when a surge pulse is applied to the pad electrode PAD, a surge current Is indicated by the dotted arrow flows. When the MOS protection element 3r is an N-type MOSFET (Metal-Oxide-Semiconductor Field Effect Transistor), the fourth wiring M41 is a ground potential (first reference potential) GND. On the other hand, when the MOS protection element 3r is a P-type MOSFET, the fourth wiring M41 is a power supply potential (second reference potential) VDD (VDD>GND).

Figure 13:
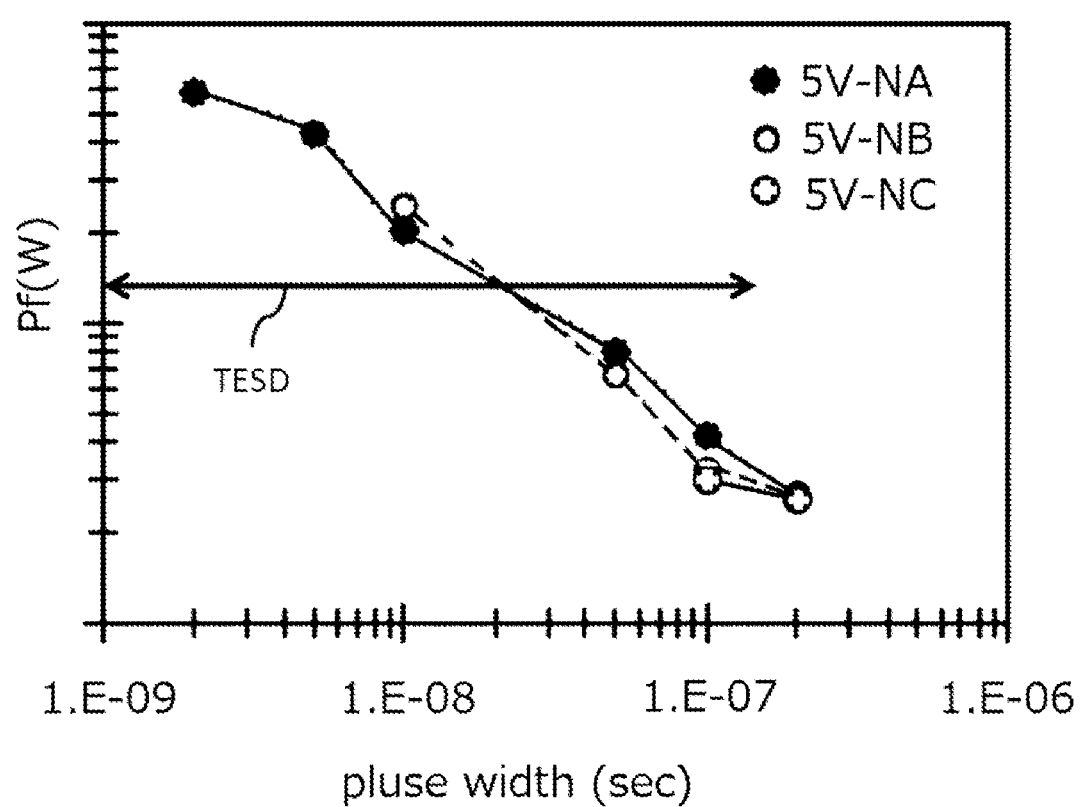
FIG. 13 is a graph showing a measurement result of the breakdown power of protection elements having different silicon areas in the case where the surge pulse width is in the range of the surge test for the consumer semiconductor devices.
Figure 14:
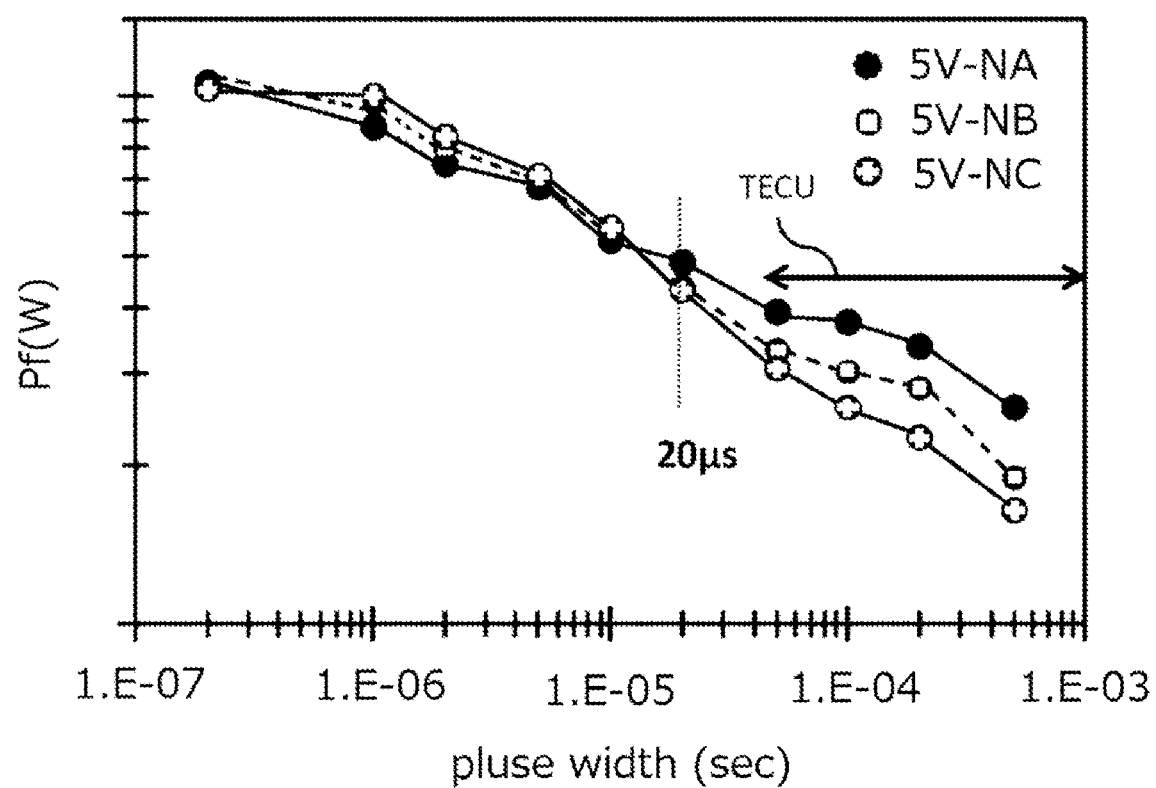
FIG. 14 is a graph showing a measurement result of the breakdown power of protection elements having different silicon areas in the case where the surge pulse width is in the range of the surge test for the automotive semiconductor devices.

FIG. 13 and FIG. 14 are graphs each showing a measurement result of the breakdown power of protection elements (N-type MOSFETs) having different silicon areas. FIG. 13 shows the measurement result in the case where the surge pulse width is in the range of the surge test for the consumer semiconductor devices. FIG. 14 shows the measurement result in the case where the surge pulse width is in the range of the surge test for the automotive semiconductor devices. In FIG. 13 and FIG. 14, the vertical axis represents the breakdown power Pf(W) per unit Si area, and the horizontal axis represents the pulse width (sec) of the surge pulse. Regarding the Si area, 5V-NA is small (×1), 5V-NB is medium (×2), and 5V-NC is large (×3). Also, the number of metal wirings on the side of the drain (D) is 28 for 5V-NA, 44 for 5V-NB, and 56 for 5V-NC. Here, as the surge test for automotive semiconductor devices (also referred to as the ECU surge test), for example, the test with test voltage: −150 V, pulse width: 2 ms, and energy: 250 mJ or the test with test voltage: +112 V, pulse width: 50 μs, and energy: 20 mJ is available. As the surge test for consumer semiconductor devices, the test with test voltage: +/−2 kV, pulse width: 150 ns, and energy: 800 nJ is available.

As shown in FIG. 13, in the time region TESD of the surge pulse in the ESD (Electro-Static Discharge (surge)) test for consumer semiconductor devices, the protection performance per unit Si area is almost the same in 5V-NA, 5V-NB, and 5V-NC.

On the other hand, as shown in FIG. 14, in the time region TECU of the surge pulse in the ECU surge test, a difference in protection performance due to the number of metal wirings on the side of the drain appears when the pulse width of the surge pulse becomes 20 μs or more. Namely, it can be found that, when the pulse width is 20 μs or more, the performance with respect to the breakdown power Pf is lowered as the number of metal wirings on the side of the drain (D) becomes larger, and the value of the breakdown power Pf has the relationship of 5V-NA>5V-NB>5V-NC.

In summary, it can be said as follows.

(1) With the miniaturization of semiconductor elements formed in semiconductor devices and the increase in the number of metal wiring layers, the performance of the protection element deteriorates significantly due to the influence of heat generation of the metal wiring caused by the surge having a long pulse width.

(2) In the narrow pitch metal wiring region, the metal wiring layers (M11 to M41, V1 to V4) are covered with the interlayer insulating film 4r having a low thermal conductivity made of a silicon oxide film ($SiO_2$) or the like, so that heat is accumulated between the adjacent wirings, which is the main cause of the performance deterioration of the protection element. Note that the thermal conductivity of copper (Cu) is 403 (W/m·K), and the thermal conductivity of aluminum (Al) is 236 (W/m·K). On the other hand, the thermal conductivity of silicon (Si) is 160 (W/m·K), and the thermal conductivity of the silicon oxide film ($SiO_2$) is 1.3 (W/m·K).

(3) It is possible to reduce the influence of the heat accumulated between the metal wirings (M11 to M41 or the like) by expanding the wiring pitch (space between wirings). In this case, however, there is a problem that the Si area of the protection element increases and the chip cost of the semiconductor device increases.

EMBODIMENT

In order to solve the problems described above, a protection element 3 according to the embodiment of the present disclosure has the following configuration.

In the protection element 3 formed on one main surface of a semiconductor substrate (SiSub), in order to improve the surge resistance against the long surge pulse width (for example, several tens μs or more), in the shape of the metal wirings (M1d to M4d, M1s to M3s) connected to the protection element 3 (here, the case where the protection element 3 is a MOSFET is described), in the layer in which the multilayer first connection wirings (referred to also as, for example, drain connection wirings) connected between the pad electrodes PAD and the drain regions D of the protection element 3 and the multilayer second connection wirings (referred to also as, for example, source connection wirings) connected between the source regions S of the protection element 3 and the bus wiring (M41) to which the ground potential GND or the power supply potential VDD is supplied are arranged adjacent to each other, either the connection wirings to the pad electrodes PAD (first connection wirings) or the connection wirings to the bus wiring 41 (second connection wirings) are laid out in a grained pattern.

By the layout arrangement described above, the density of the metal wiring can be reduced without increasing the Si area of the protection element 3. Since the density of the metal wiring can be reduced, it is possible to avoid the adverse effect of the heat accumulated in the interlayer insulating film due to the heat generation in the metal wiring region. As a result, it is possible to improve the discharge performance or heat dissipation performance of the protection element 3 against the surge having a long pulse width. For example, in a surge test with a pulse width of 50 μs, the surge resistance per unit Si area can be improved by 1.5 to 2.0 times as compared with the comparative example (see FIG. 1 and FIG. 2).

When the protection element 3 is a protection element configured by a diode or a thyristor (SCR: Silicon Controlled Rectifier), the drain connection wiring and the source connection wiring can be paraphrased as an anode connection wiring and a cathode connection wiring. The anode connection wiring is connected to the anode region of the diode or thyristor, and the cathode connection wiring is connected to the cathode region of the diode or thyristor.

Hereinafter, each example will be described with reference to the drawings.

First Example

Figure 3:
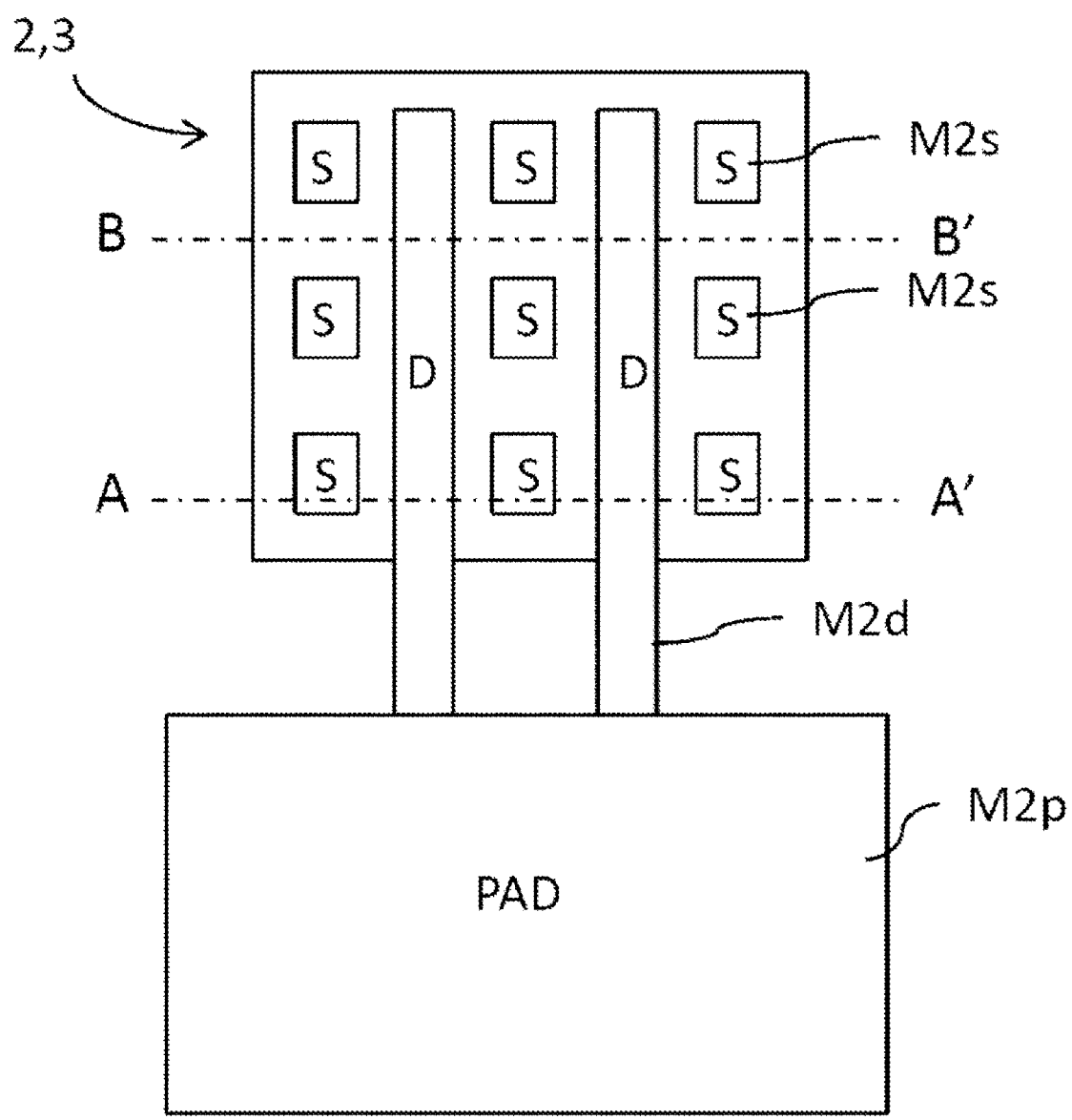
FIG. 3 is an explanatory plan view of a layout of a protection circuit according to the first example.
Figure 4:
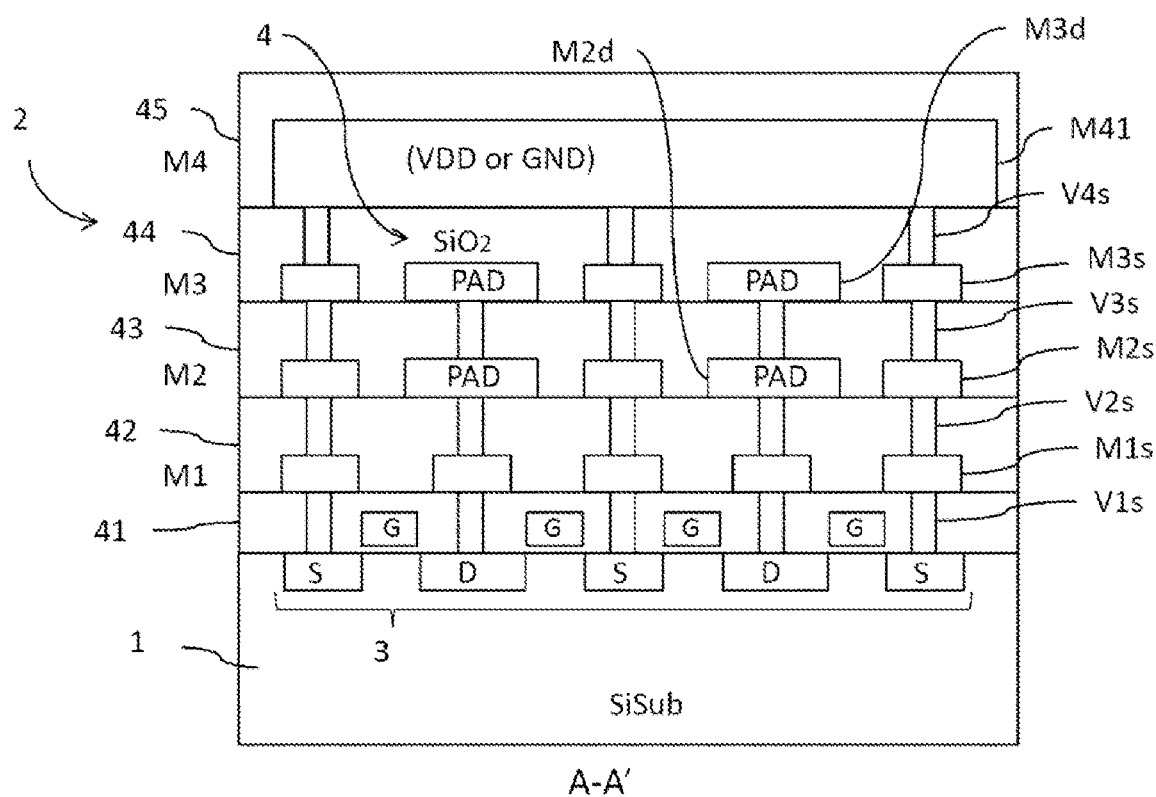
FIG. 4 is a cross-sectional view of the protection circuit taken along the line A-A' in FIG. 3.
Figure 5:
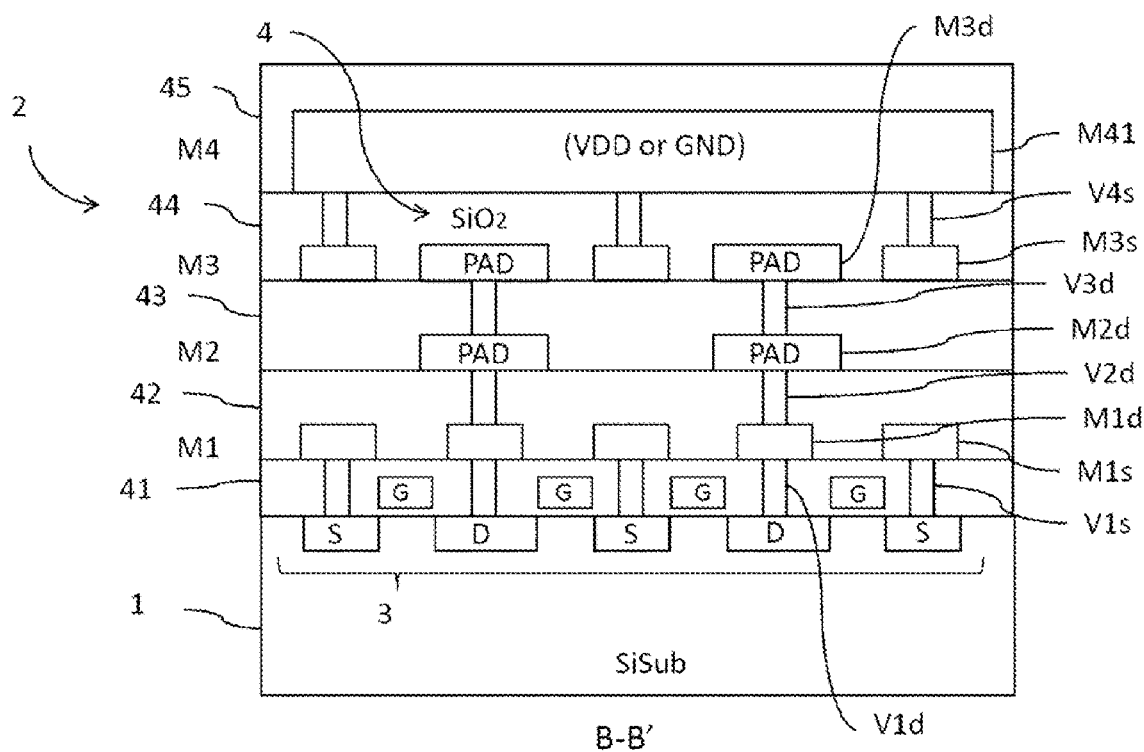
FIG. 5 is a cross-sectional view of the protection circuit taken along the line B-B' in FIG. 3.

Next, a configuration example of a layout of a protection circuit 2 according to the first example will be described with reference to FIG. 3 to FIG. 5. FIG. 3 is an explanatory plan view of a layout of a protection circuit according to the first example. FIG. 4 is a cross-sectional view of the protection circuit taken along the line A-A' in FIG. 3. FIG. 5 is a cross-sectional view of the protection circuit taken along the line B-B' in FIG. 3. In FIG. 3, in the wiring layout of the protection circuit, the wirings M2s, M2d, and M2p composed of the second wiring layer M2 are illustrated.

In the first example, in the metal wiring structure of the protection element 3 configured by the MOSFET, only the second source wirings M2s composed of the second wiring layer M2 are arranged in a grained pattern. The second source wirings M2s are laid out in a matrix pattern. In other words, the second source wirings M2s are laid out and scattered in a dot pattern (dot shape).

As shown in FIG. 3, FIG. 4, and FIG. 5, the MOS protection element 3 constituting the protection circuit 2 has gate electrodes G, source regions S, and drain regions D. The source regions S and the drain regions D are formed in the silicon semiconductor substrate (SiSub) 1, and the gate electrodes G are formed on the upper side of a gate oxide film (not shown) formed on one main surface (front surface) of the semiconductor substrate 1.

The drain region D is electrically connected to a third drain wiring M3d composed of a third wiring layer M3 through a first drain via electrode V1d, a first drain wiring M1d composed of a first wiring layer M1, a second drain via electrode V2d, a second drain wiring M2d composed of a second wiring layer M2, and a third drain via electrode V3d. The second drain wiring M2d and the third drain wiring M3d to which the drain region D is connected are connected to the pad electrode PAD. The pad electrode PAD is composed of a second pad wiring M2p formed from the second wiring layer M2. The first drain via electrode V1d can be paraphrased as a contact electrode. The multilayer first connection wiring (also referred to as drain connection wiring) connected between the pad electrode PAD and the drain region D of the protection element 3 includes the first drain via electrode V1d, the first drain wiring M1d, the second drain via electrode V2d, the second drain wiring M2d, the third drain via electrode V3d, and the third drain wiring M3d.

The source region S is electrically connected to a fourth wiring M41 composed of a fourth wiring layer M4 through a first source via electrode V1s, a first source wiring M1s composed of the first wiring layer M1, a second source via electrode V2s, the second source wiring M2s composed of the second wiring layer M2, a third source via electrode V3s, a third source wiring M3s composed of the third wiring layer M3, and a fourth source via electrode V4. The fourth wiring M41 can be paraphrased as a bus wiring. The multilayer second connection wiring (also referred to as source connection wiring) connected between the source region S of the protection element 3 and the bus wiring (M41) to which the ground potential GND or the power supply potential VDD is supplied includes the first source via electrode V1s, the first source wiring M1s, the second source via electrode V2s, the second source wiring M2s, the third source via electrode V3s, the third source wiring M3s, and the fourth source via electrode V4s.

The first to fourth wirings (M1s, M1d to M3s, M3d, M41) and the first to fourth via electrodes (V1s, V1d to V4s) are made of metal such as copper (Cu) or aluminum (Al) and are covered with an insulating film 4 having a relatively low thermal conductivity composed of a silicon oxide film (SiO$_2$) or the like. The insulating film 4 is composed of a first insulating film 41, a second insulating film 42, a third insulating film 43, a fourth insulating film 44, and a fifth insulating film 45.

The first insulating film 41 is formed on the main surface of the semiconductor substrate 1 so as to cover the source regions S and the drain regions D formed in the main surface of the semiconductor substrate 1 and the gate electrodes G on the gate oxide film formed on the main surface of the semiconductor substrate 1.

The first via electrodes (V1s, V1d) are buried in through holes (also referred to as contact holes) formed in the first insulating film 41, and are electrically connected to the source regions S and the drain regions D. The first wirings (M1s, M1d) are formed on the first insulating film 41 so as to be electrically connected to the first via electrodes (V1s, V1d). The second insulating film 42 is formed on the first insulating film 41 so as to cover the first wirings (M1s, M1d).

The second via electrodes (V2s, V2d) are buried in through holes formed in the second insulating film 42, and are electrically connected to the first wirings (M1s, M1d). The second wirings (M2s, M2d) are formed on the second insulating film 42 so as to be electrically connected to the second via electrodes (V2s, V2d). The third insulating film 43 is formed on the second insulating film 42 so as to cover the second wirings (M2s, M2d).

The third via electrodes (V3s, V3d) are buried in through hole formed in the third insulating film 43, and are electrically connected to the second wirings (M2s, M2d). The third wirings (M3s, M3d) are formed on the third insulating film 43 so as to be electrically connected to the third via electrodes (V3s, V3d). The fourth insulating film 44 is formed on the third insulating film 43 so as to cover the third wirings (M3s, M3d).

The fourth via electrodes (V4s) are buried in through holes formed in the fourth insulating film 44 and are electrically connected to the third wirings (M3s). The fourth wiring (M41) is formed on the fourth insulating film 44 so as to be electrically connected to the fourth via electrodes (V4s). The fifth insulating film 45 is formed on the fourth insulating film 44 so as to cover the fourth wiring (M41).

Here, as shown in FIG. 3, in the metal wiring structure of the protection element 3, only the second source wirings M2s composed of the second wiring layer M2 are arranged in a grained pattern. Namely, the second source wirings M2s are laid out in a matrix pattern. Alternatively, the second source wirings M2s are laid out and scattered in a dot pattern (dot shape).

As described above, since only the second source wirings M2s composed of the second wiring layer M2 are arranged in a grained pattern without increasing the Si area of the protection element 3, the density of the metal wiring of the protection element 3 can be reduced. Since the density of the metal wiring can be reduced, it is possible to avoid the adverse effect of the heat accumulated in the interlayer insulating film due to the heat generation in the metal wiring region. As a result, it is possible to improve the discharge performance or heat dissipation performance of the protection element 3 against the surge having a long pulse width.

Second Example

Figure 6:
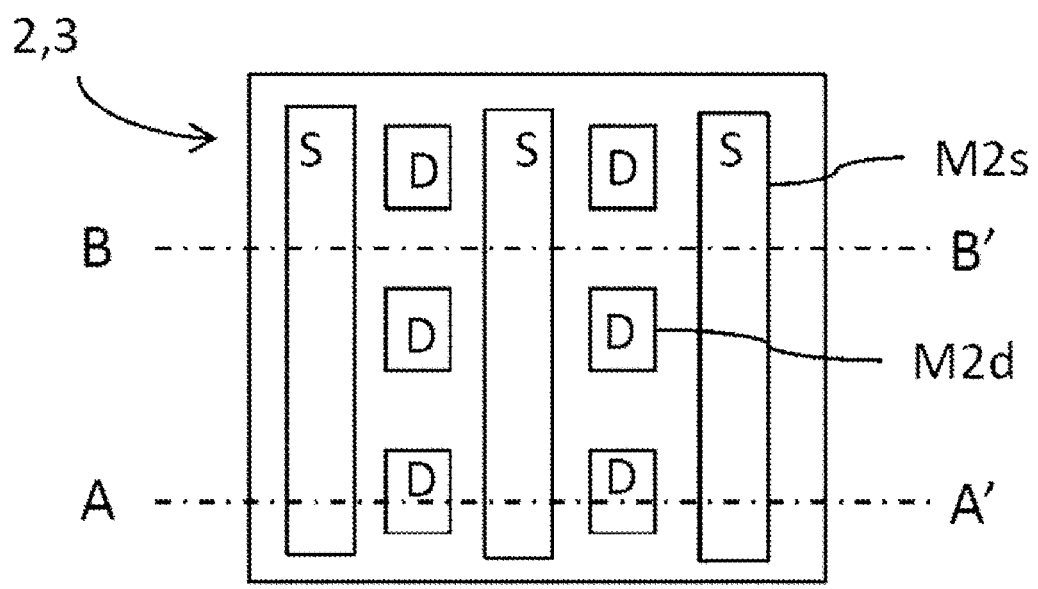
FIG. 6 is an explanatory plan view of a layout of a protection circuit according to the second example.
Figure 6:
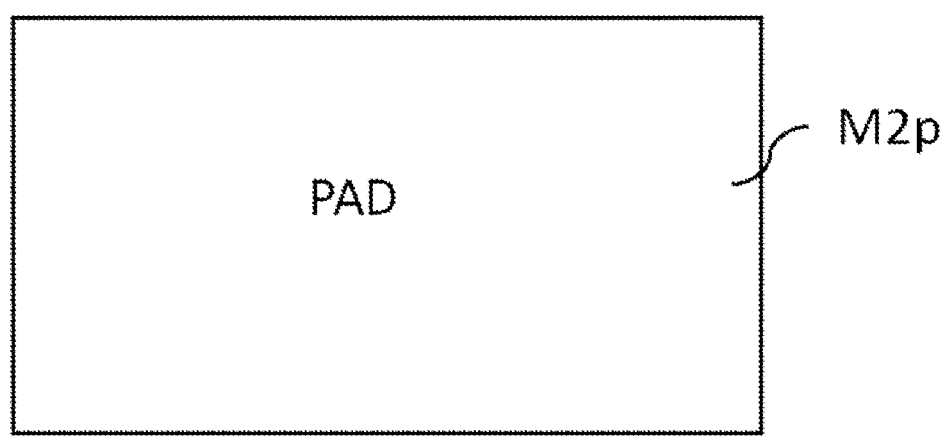
Figure 7:
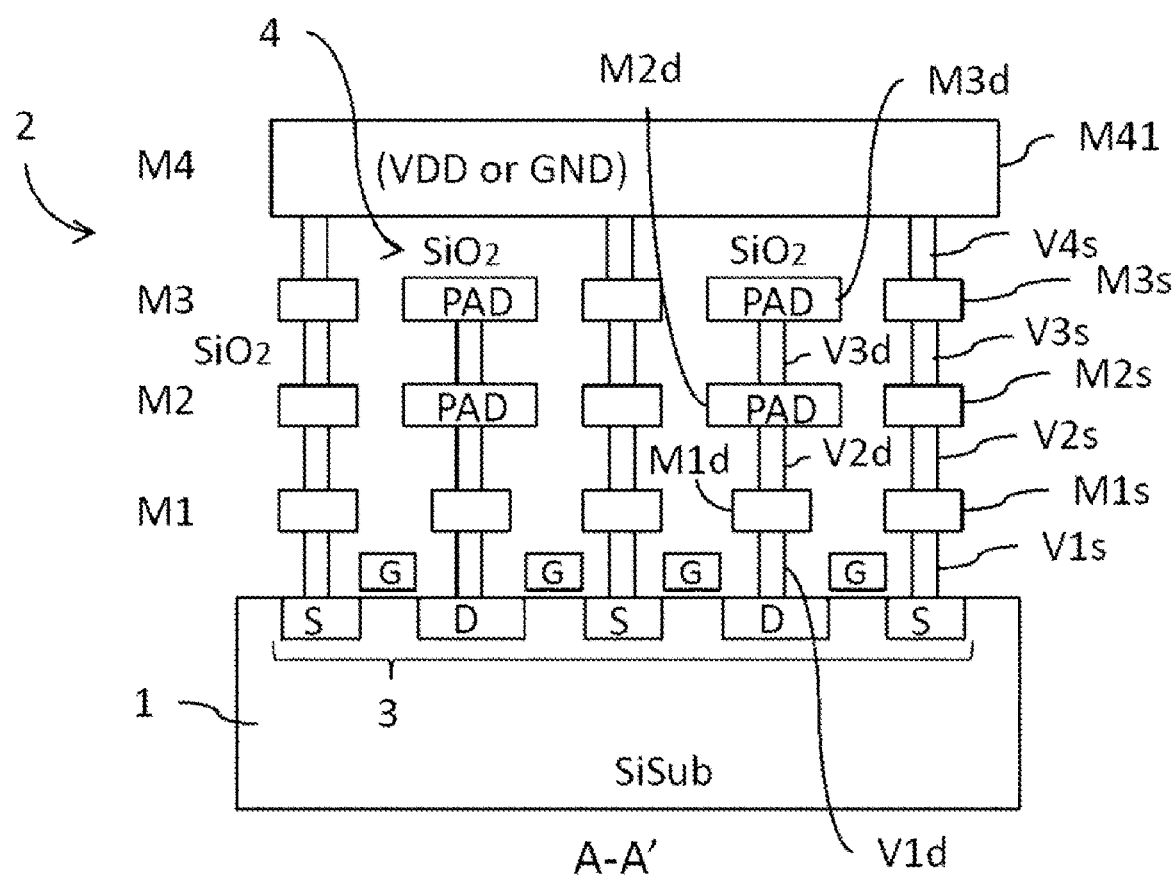
FIG. 7 is a cross-sectional view of the protection circuit taken along the line A-A' in FIG. 6.
Figure 8:
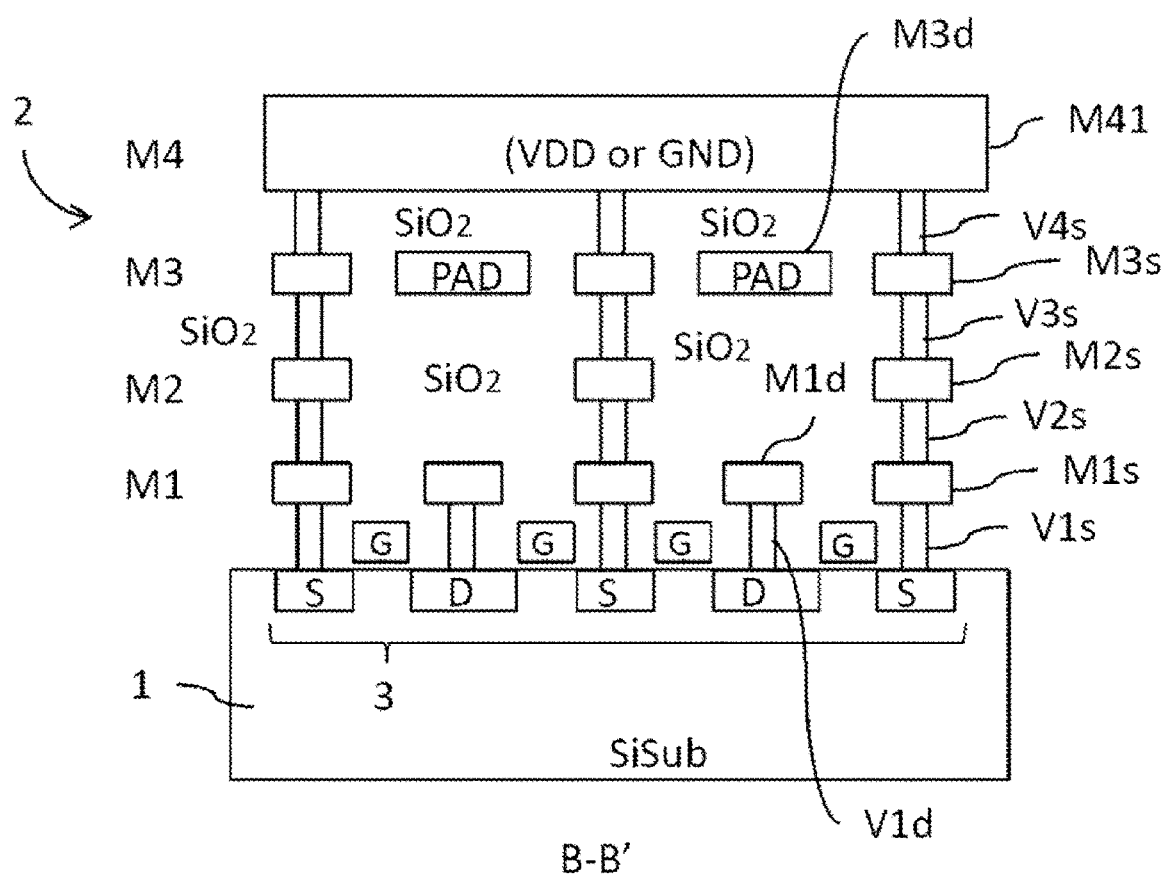
FIG. 8 is a cross-sectional view of the protection circuit taken along the line B-B' in FIG. 6.

Next, a configuration example of a layout of a protection circuit 2 according to the second example will be described with reference to FIG. 6 to FIG. 8. FIG. 6 is an explanatory plan view of a layout of a protection circuit according to the second example. FIG. 7 is a cross-sectional view of the protection circuit taken along the line A-A' in FIG. 6. FIG. 8 is a cross-sectional view of the protection circuit taken along the line B-B' in FIG. 6. In FIG. 6, in the wiring layout of the protection circuit, the wirings M2s, M2d, and M2p composed of the second wiring layer M2 are illustrated. Illustration of the insulating films (41, 42, 43, 44, 45) is omitted for simplifying the drawings.

In the second example, as shown in FIG. 6, in the metal wiring structure of the protection element 3 configured by the MOSFET, only the second drain wirings M2d composed of the second wiring layer M2 are arranged in a grained pattern (the second drain wirings M2d are laid out in a matrix pattern). Alternatively, the second drain wirings M2d are laid out and scattered in a dot pattern (dot shape). Since the other configuration of the second example is the same as the first example, the duplicate description will be omitted.

As described above, since only the second drain wirings M2d composed of the second wiring layer M2 are arranged in a grained pattern without increasing the Si area of the protection element 3, the density of the metal wiring of the protection element 3 can be reduced. Since the density of the metal wiring can be reduced, it is possible to avoid the adverse effect of the heat accumulated in the interlayer insulating film due to the heat generation in the metal wiring region. As a result, it is possible to improve the discharge performance or heat dissipation performance of the protection element 3 against the surge having a long pulse width.

Third Example

The first example is the configuration example in which only the second source wirings M2s composed of the second wiring layer M2 are arranged in a grained pattern, and the second example is the configuration in which only the second drain wirings M2d composed of the second wiring layer M2 are arranged in a grained pattern. The third example is the configuration example in which the second drain wirings M2d composed of the second wiring layer M2 are arranged in a grained pattern and further the third source wirings M3s composed of the third wiring layer M3 are arranged in a grained pattern.

Figure 9:
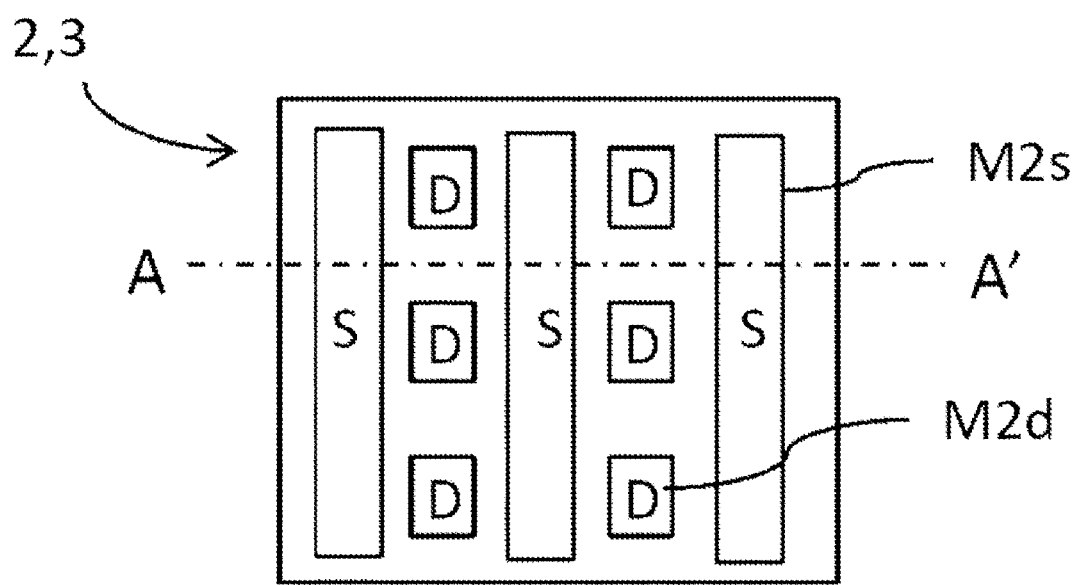
FIG. 9 is an explanatory plan view of an arrangement example in a second wiring layer M2 in a layout of a protection circuit according to the third example.
Figure 9:
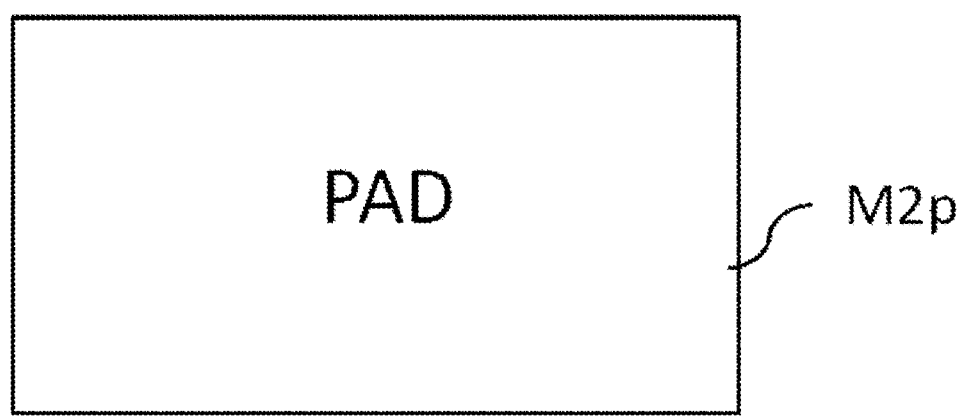
Figure 10:
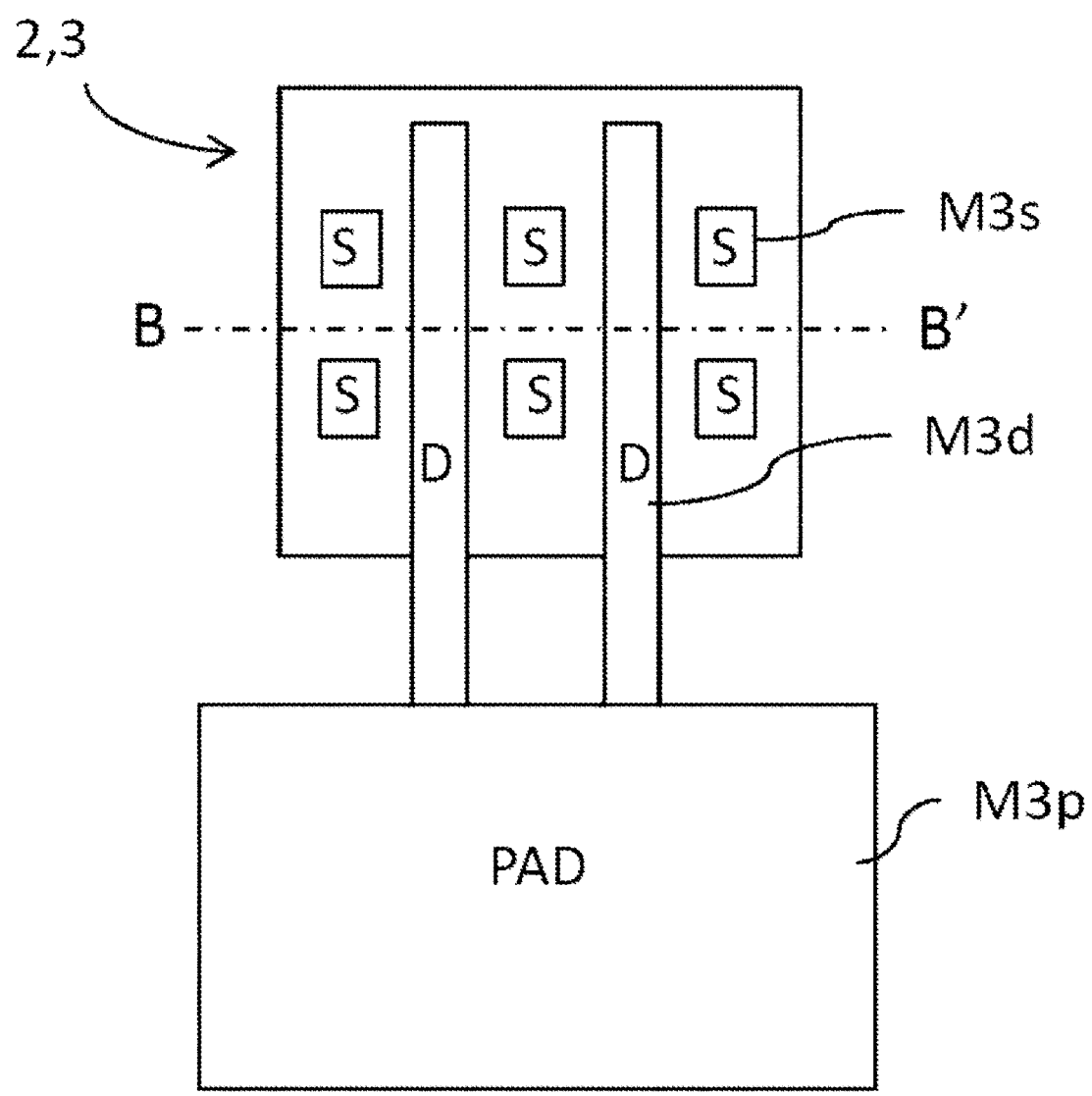
FIG. 10 is an explanatory plan view of an arrangement example in a third wiring layer M3 in the layout of the protection circuit according to the third example.
Figure 11:
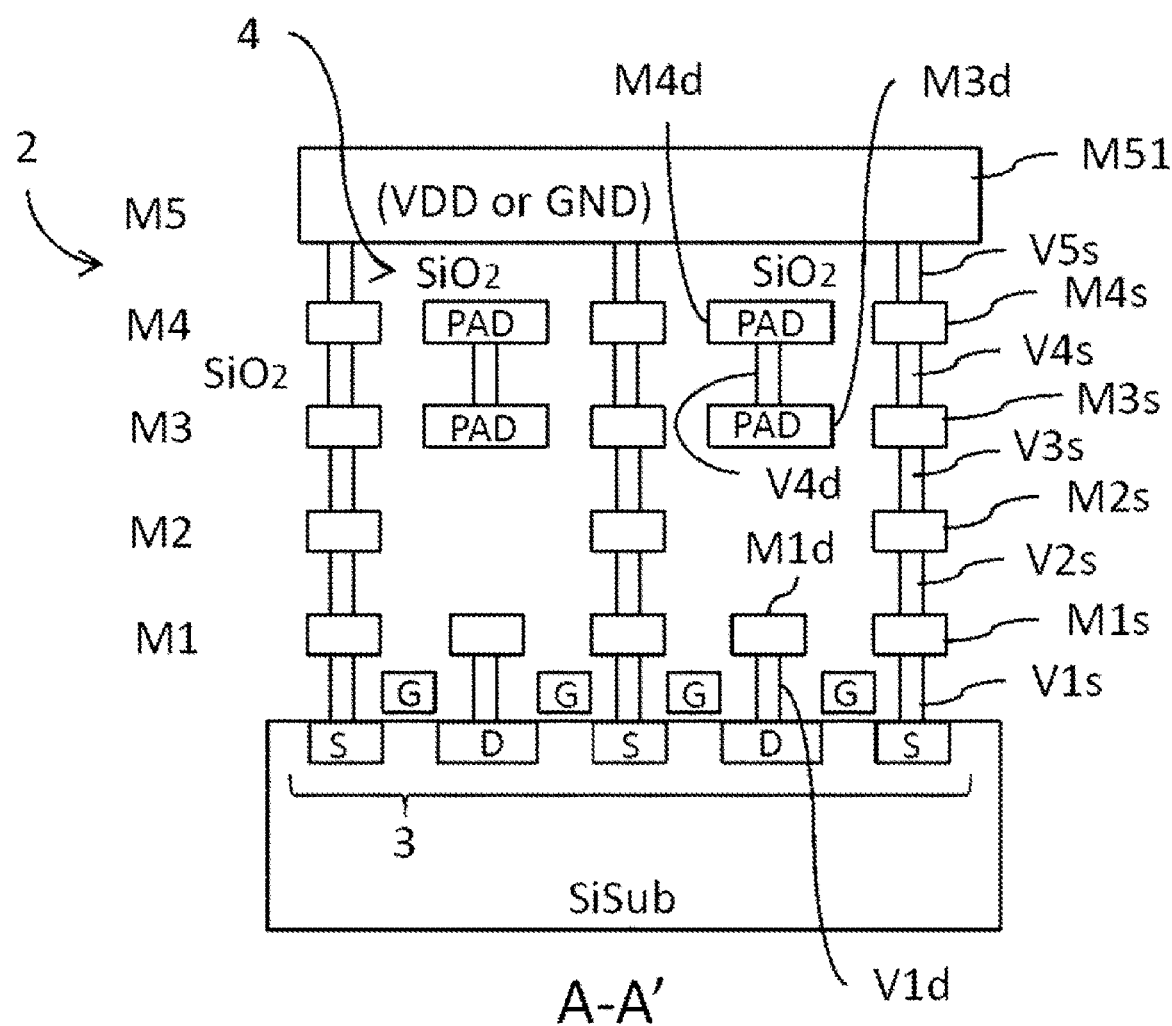
FIG. 11 is a cross-sectional view of the protection circuit taken along the line A-A' in FIG. 9.
Figure 12:
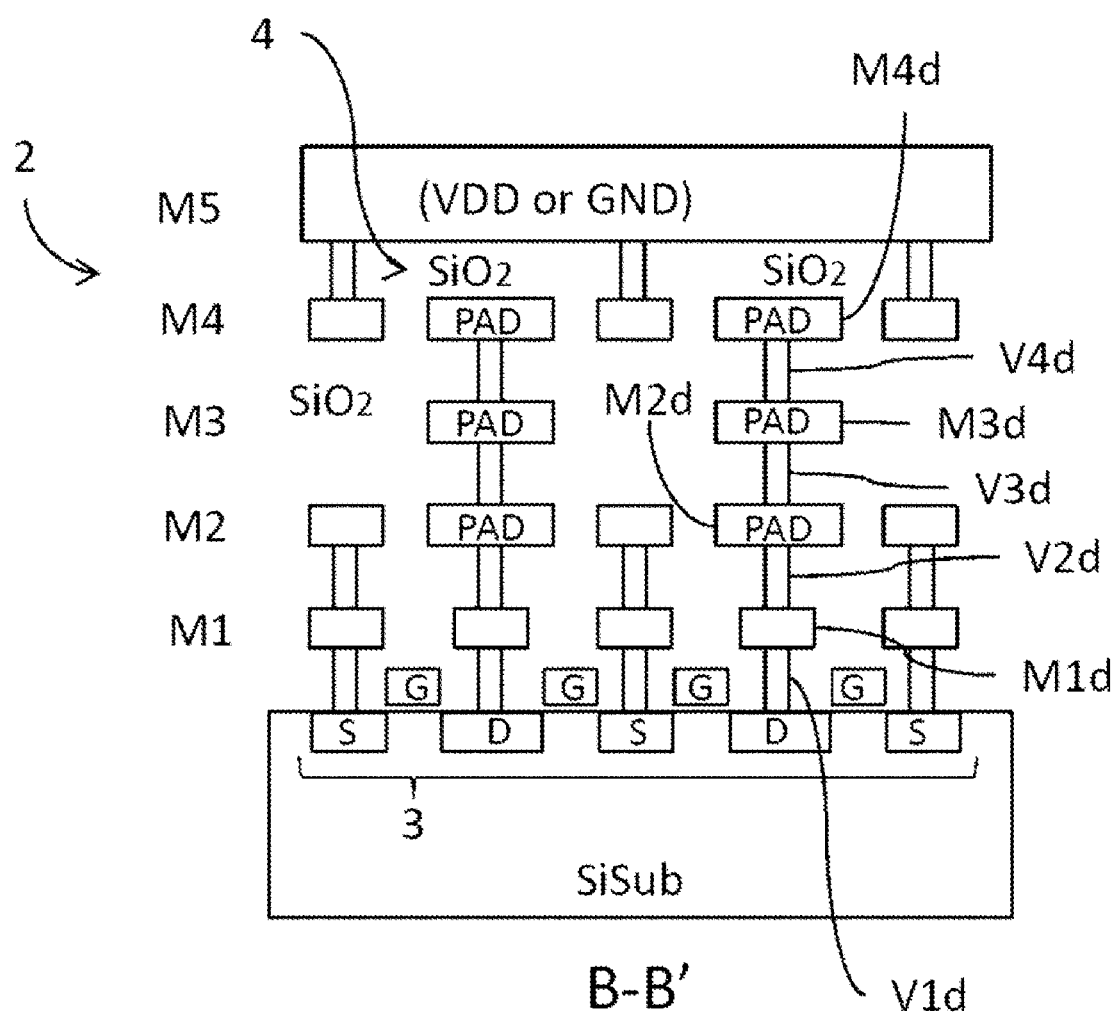
FIG. 12 is a cross-sectional view of the protection circuit taken along the line B-B' in FIG. 10.

A configuration example of a layout of a protection circuit 2 according to the third example will be described with reference to FIG. 9 to FIG. 12. FIG. 9 is an explanatory plan view of an arrangement example in the second wiring layer M2 in the layout of the protection circuit according to the third example. FIG. 10 is an explanatory plan view of an arrangement example in the third wiring layer M3 in the layout of the protection circuit according to the third example. FIG. 11 is a cross-sectional view of the protection circuit taken along the line A-A' in FIG. 9. FIG. 12 is a cross-sectional view of the protection circuit taken along the line B-B' in FIG. 10. In FIG. 9, in the wiring layout of the protection circuit 2, the wirings M2s, M2d, and M2p composed of the second wiring layer M2 are illustrated. In FIG. 10, in the wiring layout of the protection circuit 2, the wirings M3s, M3d, and M3p composed of the third wiring layer M3 are illustrated. Illustration of the insulating films (41, 42, 43, 44, 45, and the like) is omitted for simplifying the drawings.

The third example is different from the first and second examples in that a fifth wiring layer M5 as a wiring layer is added and a bus wiring to which the source regions S of the protection element 3 are connected and the ground potential GND or the power supply potential VDD is supplied is changed to a bus wiring M51 composed of the fifth wiring layer M5. Therefore, as shown in FIG. 11 and FIG. 12, a source wiring M4s, a fifth via electrode V5s, a fourth via electrode V4d, and a drain wiring M4d are added.

The multilayer first connection wiring (also referred to as drain connection wiring) connected between the pad electrode PAD and the drain region D of the protection element 3 includes the first drain via electrode V1d, the first drain wiring M1d, the second drain via electrode V2d, the second drain wiring M2d, the third drain via electrode V3d, the third drain wiring M3d, the fourth drain via electrode V4d, and the fourth drain wiring M4d.

The multilayer second connection wiring (also referred to as source connection wiring) connected between the source region S of the protection element 3 and the bus wiring (M51) to which the ground potential GND or the power supply potential VDD is supplied includes the first source via electrode V1s, the first source wiring M1s, the second source via electrode V2s, the second source wiring M2s, the third source via electrode V3s, the third source wiring M3s, the fourth source via electrode V4s, the fourth source wiring M4d, and the fifth source via electrode V5s. Since the other configuration of the third example is the same as the first and second examples, the duplicate description will be omitted.

In the third example, as shown in FIG. 9, in the metal wiring structure of the protection element 3 configured by the MOSFET, the drain wirings M2d composed of the second wiring layer M2 are arranged in a grained pattern, and as shown in FIG. 10, in the metal wiring structure of the protection element 3 configured by the MOSFET, the source wirings M3s composed of the third wiring layer M3 are arranged in a grained pattern. Further, the drain connection wirings (M2d) laid out in the grained pattern and the source connection wirings (M3s) laid out in the grained pattern are arranged alternately diagonally in a plan view.

As described above, since the drain wirings M2d composed of the second wiring layer M2 are arranged in a grained pattern and the source wirings M3s composed of the third wiring layer M3 are arranged in a grained pattern without increasing the Si area of the protection element 3, the density of the metal wiring of the protection element 3 can be reduced. Since the density of the metal wiring can be reduced, it is possible to avoid the adverse effect of the heat accumulated in the interlayer insulating film due to the heat generation in the metal wiring region. As a result, it is possible to improve the discharge performance or heat dissipation performance of the protection element 3 against the surge having a long pulse width.

Further, although it is important to reduce the impedance of the entire discharge path for the surge having a short pulse width (several μs or less), the protection performance even for the surge having a short pulse width is not deteriorated by evenly thinning out the drain wirings and the source wirings as in the third example.

MODIFICATION

When the protection element 3 is a protection element configured by a diode or a thyristor (SCR: Silicon Controlled Rectifier), the drain connection wiring and the source connection wiring can be paraphrased as an anode connection wiring and a cathode connection wiring.

The configuration of the protection element 3 according to the present disclosure can be summarized as follows.

(1) The protection element 3 configured by the MOSFET of the semiconductor device (or semiconductor integrated circuit) has the multilayer metal wiring structure, and in a part of the layer (for example, the second wiring layer M2 or the third wiring layer M3) of the multilayer metal wiring structure where both the drain connection wirings (M2d, M3d) and the source connection wirings (M2s, M3s) are present, only either the drain connection wirings (M2d, M3d) or the source connection wirings (M2s, M3s) are arranged in a grained pattern.

(2) In the (1) above, both the drain connection wirings (M2d) and the source connection wirings (M3s) are arranged in a grained pattern, and the drain connection wirings (M2d) laid out in the grained pattern and the source connection wirings (M3s) laid out in the grained pattern are formed in different layers in the multilayer metal wiring structure (see the third example, FIG. 9 and FIG. 10).

(3) In the (2) above, the drain connection wirings (M2d) laid out in the grained pattern and the source connection wirings (M3s) laid out in the grained pattern are arranged alternately diagonally in a plan view (see FIG. 9 and FIG. 10).

(4) The protection element 3 configured by the diode of the semiconductor device (or semiconductor integrated circuit) has the multilayer metal wiring structure, and in a part of the layer (for example, the second wiring layer M2 or the third wiring layer M3) of the multilayer metal wiring structure where both the anode connection wirings (M2d, M3d) and the cathode connection wirings (M2s, M3s) are present, only either the anode connection wirings (M2d, M3d) or the cathode connection wirings (M2s, M3s) are arranged in a grained pattern.

(5) The protection element 3 configured by the thyristor of the semiconductor device (or semiconductor integrated circuit) has the multilayer metal wiring structure, and in a part of the layer (for example, the second wiring layer M2 or the third wiring layer M3) of the multilayer metal wiring structure where both the anode connection wirings (M2d, M3d) and the cathode connection wirings (M2s, M3s) are present, only either the anode connection wirings (M2d, M3d) or the cathode connection wirings (M2s, M3s) are arranged in a grained pattern.

In the foregoing, the invention made by the inventors has been specifically described based on the embodiment and the examples, but it goes without saying that the present invention is not limited to the embodiment and the examples described above and can be variously modified.

What is claimed is:

1. A semiconductor device comprising a protection element configured by a MOSFET,
    wherein the protection element has a multilayer metal wiring structure,
    wherein the multilayer metal wiring structure includes drain connection wirings connected to drain regions of the MOSFET and source connection wirings connected to source regions of the MOSFET, and
    wherein, in a part of a layer of the multilayer metal wiring structure where both the drain connection wirings and the source connection wirings are present, only either the drain connection wirings or the source connection wirings are laid out in a grained pattern.

2. The semiconductor device according to claim 1,
    wherein both the drain connection wirings and the source connection wirings are laid out in a grained pattern, and
    wherein the drain connection wirings laid out in the grained pattern and the source connection wirings laid out in the grained pattern are formed in different layers in the multilayer metal wiring structure.

3. The semiconductor device according to claim 2,
    wherein the drain connection wirings laid out in the grained pattern and the source connection wirings laid out in the grained pattern are arranged alternately diagonally in a plan view.

4. A semiconductor device comprising a protection element configured by a diode,
    wherein the protection element has a multilayer metal wiring structure,
    wherein the multilayer metal wiring structure includes anode connection wirings connected to anode regions of the diode and cathode connection wirings connected to cathode regions of the diode, and
    wherein, in a part of a layer of the multilayer metal wiring structure where both the anode connection wirings and the cathode connection wirings are present, only either the anode connection wirings or the cathode connection wirings are laid out in a grained pattern.

5. A semiconductor device comprising a protection element configured by a thyristor,
    wherein the protection element has a multilayer metal wiring structure,
    wherein the multilayer metal wiring structure includes anode connection wirings connected to anode regions of the thyristor and cathode connection wirings connected to cathode regions of the thyristor, and
    wherein, in a part of a layer of the multilayer metal wiring structure where both the anode connection wirings and the cathode connection wirings are present, only either the anode connection wirings or the cathode connection wirings are laid out in a grained pattern.

* * * * *